United States Patent
Grodzki

(10) Patent No.: US 10,459,050 B2
(45) Date of Patent: Oct. 29, 2019

(54) MAGNETIC RESONANCE METHOD AND APPARATUS FOR REDUCING THE REPETITION TIME WITHOUT INCREASING THE GRADIENT CAPACITY UTILIZATION

(71) Applicant: Siemens Healthcare GmbH, Erlangen (DE)

(72) Inventor: David Grodzki, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 147 days.

(21) Appl. No.: 15/717,012

(22) Filed: Sep. 27, 2017

(65) Prior Publication Data
US 2018/0088196 A1    Mar. 29, 2018

(30) Foreign Application Priority Data
Sep. 27, 2016 (DE) .................. 10 2016 218 557

(51) Int. Cl.
| G01R 33/48 | (2006.01) |
| G01R 33/561 | (2006.01) |
| G01R 33/385 | (2006.01) |
| G01R 33/54 | (2006.01) |

(52) U.S. Cl.
CPC ....... *G01R 33/4818* (2013.01); *G01R 33/385* (2013.01); *G01R 33/543* (2013.01); *G01R 33/561* (2013.01)

(58) Field of Classification Search
CPC .......... G01R 33/4818; G01R 33/543; G01R 33/561; G01R 33/385
See application file for complete search history.

(56) References Cited

U.S. PATENT DOCUMENTS

| 6,288,547 B1* | 9/2001 | Heid .................. G01R 33/3852 324/307 |
| 2015/0108981 A1* | 4/2015 | Grodzki ............. G01R 33/3671 324/318 |
| 2017/0045594 A1* | 2/2017 | Grodzki ............... G01R 33/385 |

FOREIGN PATENT DOCUMENTS

| DE | 102012216711 A1 | 2/2014 |
| DE | 102012222149 B4 | 9/2014 |

(Continued)

OTHER PUBLICATIONS

Office Action dated Jul. 12, 2019 for German Application No. 102016218557.8.

*Primary Examiner* — G. M. A Hyder
(74) *Attorney, Agent, or Firm* — Schiff Hardin LLP

(57) ABSTRACT

In a method and magnetic resonance (MR) apparatus for generating scan data of an examination object, radiation of RF pulses, activation of gradients, and reading out of MR signals generated by the radiated RF pulses and the activated gradients occur according to a pulse sequence. The signals that are stored as scan data. Repetition of the pulse sequence activating respective other gradients takes place until all the desired scan data are stored, wherein for determined repetitions, no gradients are activated. By the performance of repetitions in which no gradients are switched, a minimum repetition time, which is restricted by the utilized gradient unit due to hardware limitations thereof, can be further reduced. Thus repetition times can be selected more freely, e.g. according to a desired contrast, including on magnetic resonance systems with a low gradient output.

9 Claims, 2 Drawing Sheets

(56) References Cited

FOREIGN PATENT DOCUMENTS

DE 102014205004 B3 8/2015
DE 102013217617 B4 12/2018

* cited by examiner

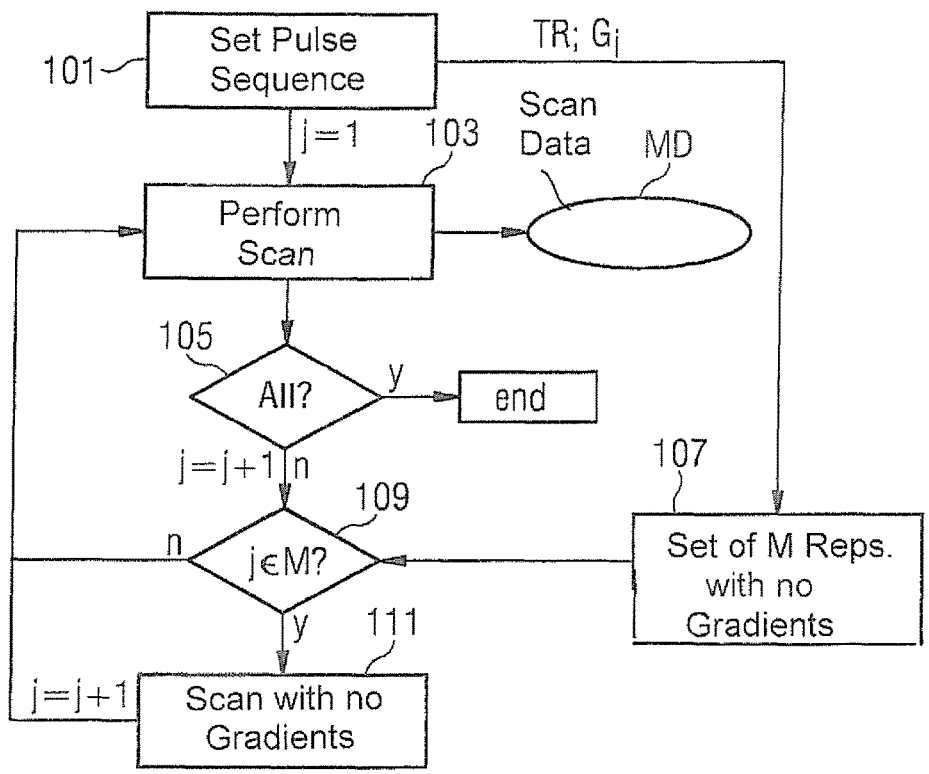
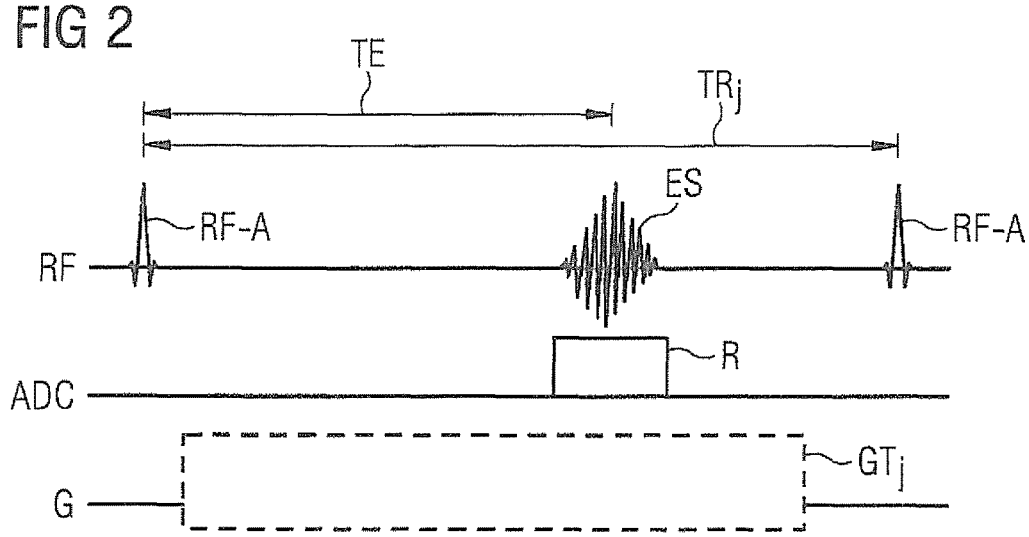

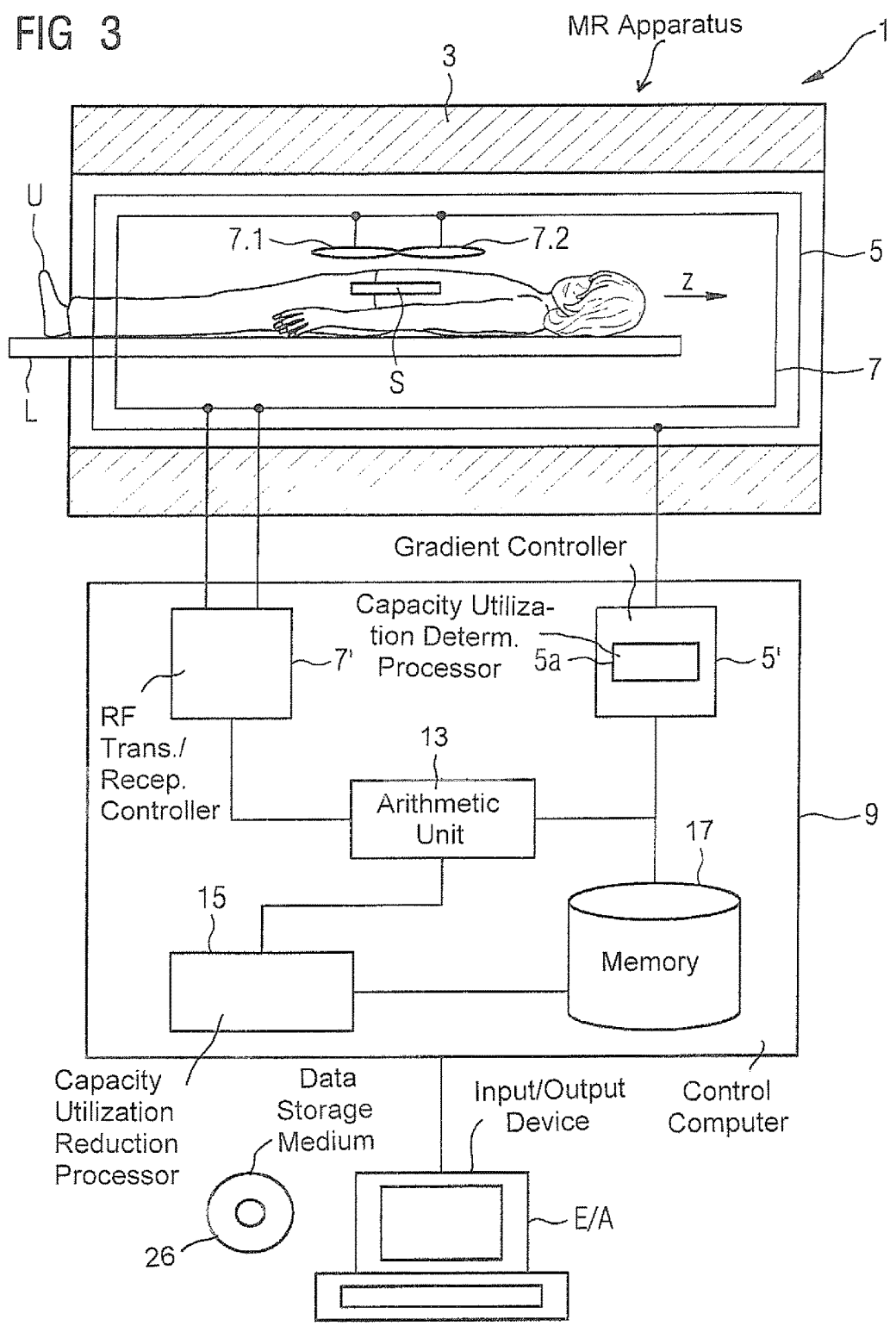

MAGNETIC RESONANCE METHOD AND APPARATUS FOR REDUCING THE REPETITION TIME WITHOUT INCREASING THE GRADIENT CAPACITY UTILIZATION

BACKGROUND OF THE INVENTION

Field of the Invention

The invention concerns a technique to shorten the repetition time without increasing the gradient capacity utilization in magnetic resonance technology.

Description of the Prior Art

Magnetic resonance (MR) technology is a known modality with which images of the interior of an examination object can be generated. Expressed simply, for this purpose, the examination object is positioned in a magnetic resonance scanner in a strong, static, homogeneous basic magnetic field, also known as the $B_0$ field, with field strengths of 0.2 Tesla to 7 Tesla or more, so that nuclear spins of the object orient along the basic magnetic field. In order to trigger nuclear resonances, radio-frequency excitation pulses (RF pulses) are radiated into the examination object, and the signals triggered thereby are measured as so-called k-space data and, on the basis thereof, MR images are reconstructed or spectroscopic data are determined. For spatially encoding the scan data, rapidly switched magnetic gradient fields are overlaid on the basic magnetic field. The scan data recorded are digitized and stored as complex numerical values in a k-space matrix. From the k-space matrix populated with such values, an associated MR image is reconstructed, such as by using a multi-dimensional Fourier transform.

For the spatial encoding, gradient fields are generated by respective gradient coils of a gradient unit in the three spatial directions, x, y and z, corresponding to the axes of the gradient coil arrangement. Depending on the desired contrast and type of pulse sequence used, the gradient coils are more or less severely loaded.

Particularly with diffusion-weighted imaging (DWI), significant demands are made on the gradient unit in order for the capacity thereof to be fully utilized.

This full utilization is enabled, for example, by a "balance model," which takes into account both short-period constants (in the millisecond range) and long-period constants (in the minute range) of the gradient amplifier ("gradient power amplifier", GPA) of the gradient control system. In the minute range, primarily the utilization of the so-called gradient-duty-cycle or the nominal gradient field strength $G_{nom}$ is of decisive importance. Both variables scale with the mean square of the gradient field strength $G_i^2$ on the axes i=x, y, z, and are primarily defined by the utilization and heating of the respective gradient coil, the GPA, and the transformer of the gradient control system.

As soon as a protocol is set for a scan to be performed, the balance model restricts the available parameter range such that none of the boundary conditions imposed by hardware limitations of the gradient control system can be exceeded. Thus it can occur with the use of the balance model that, for example, short repetition times (TR) are not permitted, because otherwise a pre-determined mean $G_i^2$ would be exceeded. The smaller the pre-set maximum value for $G_i^2$, the more severely and more frequently this problem arises, particularly in magnetic resonance systems having relatively non-robustly designed gradient units. Under some circumstances, however, precisely such short repetition times prohibited by the balance model are particularly advantageous for a desired MR imaging scan and the image contrast desirable therefor.

Short repetition times can also be desirable, for example, when comparability of different scans that have been made on different magnetic resonance systems is desired, or necessary. This can be the case for follow-up checks, e.g. in the context of a therapy when a first scan has been made with a determined repetition time that, on another magnetic resonance system on which a later scan is to be carried out, is not permitted due to hardware limitations prevailing there. In this event, the respective scans to be carried out with different repetition times are at best conditionally comparable, e.g. due to the resulting different contrasts.

SUMMARY OF THE INVENTION

An object of the present invention is to enable shorter repetition times TR than a maximum gradient capacity utilization of the utilized scanner actually permits.

The method according to the invention for generating MR scan data of an examination object has the following steps. An MR data acquisition scanner is operated in order to radiate RF pulses, activate gradients, and read out signals from nuclear spins of an object that were excited by the radiated RF pulses and defined by the gradients according to a pulse sequence. The MR signals that are read out are stored as scan data. The pulse sequence is repeated while activating respective other gradients so often until all the desired scan data are stored, wherein for determined repetitions, no gradients are activated.

By the inventive performance of repetitions in which no gradients are activated, a minimum repetition time, which is restricted by utilized gradient unit due to hardware limitations thereof, can be further reduced. Thus repetition times can be selected more freely, e.g. according to a desired contrast or for an improved reproducibility and comparability of different scans, including those conducted with magnetic resonance systems with a low gradient capacity.

Particularly if the specifications of the gradient unit of a magnetic resonance system being used allow only a low nominal gradient field strength Gnom, normally only relatively long repetition times TR (and thus overall also a longer total scan time) are possible, in order not to overload the gradient unit, and to keep a mean square of the gradient field strengths $G_i^2$ over the total scan time in the three axes i=x, y, z within the limits possible with the gradient unit. Such magnetic resonance systems profit to a particular extent from the inventive method. In this way, it is also possible with magnetic resonance systems having a low gradient specification to achieve the same repetition times TR as in magnetic resonance systems with a high-grade gradient unit with higher gradient specifications, so that scans can be made more comparable.

An inventive magnetic resonance apparatus has a scanner with a basic field magnet, a gradient unit, a radio-frequency antenna, and a control computer configured to implement the inventive method, with a gradient control system that has a capacity utilization determining processor and a capacity utilization reduction processor.

The present invention also encompasses a non-transitory, computer-readable data storage medium encoded with programming instructions (program code) that, when the storage medium is loaded into a computer or computer system of a magnetic resonance apparatus, cause the computer or computer system to operate the magnetic resonance apparatus in order to implement any or all of the embodiments of the method according to the invention, as described above.

The advantages and details described with respect to the method apply as well to the magnetic resonance apparatus and the electronically readable data carrier.

BRIEF DESCRIPTION OF THE DRAWINGS

FIG. 1 is a flowchart of the inventive method.

FIG. 2 is a schematically illustrated pulse sequence diagram, as can be used for the inventive method.

FIG. 3 is a schematically illustrated inventive magnetic resonance apparatus.

DESCRIPTION OF THE PREFERRED EMBODIMENTS

FIG. 1 shows a flowchart of the inventive method for generating scan data of an examination object by magnetic resonance technology.

Initially, a pulse sequence to be used for a desired scan of an examination object and parameters desired therefor, for example, a desired contrast, a desired field of view (FOV) and/or a desired resolution, are set (block 101).

According to the selected pulse sequence, initially in a first repetition (j=1), RF pulses are radiated into the examination object and gradients are activated in order to read out and store MR signals generated thereby as scan data MD in k-space along trajectories determined by the pulse sequence (block 103).

Following the performance of a repetition according to the selected pulse sequence (block 103), in a query 105, it is tested whether all the desired scan data MD have already been read out and stored. If this is the case ("y", 105), the scan ends ("end"). If not all the desired scan data MD have been read out and stored ("n", 105), a next repetition is prepared (the counter for the repetitions j is thus incremented by one (j=j+1)) and in a further query 109, it is tested whether the next repetition $TR_j$ is one of the determined repetitions $TR_{j \in M}$ in the set M in which no gradients are activated, provided in block 107.

If the next repetition $TR_j$ is a repetition $TR_j$ of the set M of determined repetitions $TR_{j \in M}$ ("Y", 109), a repetition of the pulse sequence is carried out in which no gradients are activated (block 111).

The counter of the repetitions is again incremented by one (j=j+1) after a scan without activated gradients 111 and a next repetition $TR_j$ is carried out with the next provided gradients (block 103).

If the next repetition $TR_j$ on the enquiry 109 is not a repetition $TR_j$ from the set M of determined repetitions $TR_{j \in M}$ ("n", 109), the next repetition $TR_j$ of the pulse sequence is carried out again in accordance with block 103.

Herein, in each repetition $TR_j$, regardless of whether the repetition $TR_j$ is one of the determined repetitions $TR_{j \in M}$, an excitation RF pulse can be radiated. By this means, for example, a steady state can easily be maintained. A repetition $TR_j$ of the set M of determined repetitions $TR_{j \in M}$ then includes at least the excitation RF pulse, although it can otherwise be "empty".

The set M of the determined repetitions $TR_{j \in M}$ in which no gradients are to be activated can be ascertained, for example, on the basis of a gradient capacity utilization determined, e.g. on the basis of the gradient field strengths $G_i$, to be activated in the selected pulse sequence, which capacity utilization is to be reduced, for example, by the repetitions $TR_{j \in M}$ contained in the set M, at least on average over a pre-determined time period such that, for example, a desired TR can be achieved or such that a desired pulse sequence is executable at all with the magnetic resonance scanner to be used, while observing given hardware limitations. A gradient capacity utilization is settable as a mean value over a pre-determined time period, e.g. over the total scan time, of the squares of the gradient field strengths to be activated in the three axes i, $\overline{(G_i^2)}$. By means of the repetitions in which no gradients are activated, the gradient capacity utilization averaged over a number of repetitions decreases.

The set M of the determined repetitions $TR_{j \in M}$ in which no gradients are to be activated can thus also be determined on the basis of a desired repetition time TR that is to be achieved.

In an exemplary embodiment, the set M of the determined repetitions $TR_{j \in M}$ in which no gradients are to be activated can thus simply be determined as the set of each n-th repetition $TR_j$: $M=\{j|j=k*n\}$, where k is a positive integer. As described above, the number n can be determined dependent upon a gradient capacity utilization initially determined by the selected pulse sequence and/or by a desired repetition time TR.

The set M of the determined repetitions $TR_{j \in M}$ in which no gradients are to be activated can be determined such that a mean gradient capacity utilization over a particular number of repetitions does not exceed a pre-determined threshold. The predetermined threshold can be determined by hardware limitations of the gradient unit used.

If a magnetic resonance scanner has a gradient unit with specifications that do not enable a minimum repetition time $TR_{min}$ to be undershot for a desired pulse sequence, then with the inventive method, by carrying out repetitions of the pulse sequence in which no gradients are activated, this minimum repetition time $TR_{min}$ is indeed undershot. For this purpose, a set M of determined repetitions $TR_{j \in M}$ is defined in which no gradients are to be activated. The set M can be defined according to a desired new minimum repetition time $TR_{min,neu}$, for example, dependent upon the ratio of the minimum repetition time $TR_{min}$ specified by the hardware limitations of the gradient unit used and the desired new reduced minimum repetition time $TR_{min,neu}$, for example, such that a gradient capacity utilization $G_i^2$ averaged over a particular number of repetitions, e.g. the total scan time or e.g. sectionally over particular related regions of the k-space, is smaller than or the same as the corresponding gradient capacity utilization achieved with the minimum repetition time $TR_{min}$. By means of the repetitions in which no gradients are activated, a gradient capacity utilization averaged over a number of repetitions falls, so that the previous minimum repetition time $TR_{min}$ can be further reduced without exceeding a maximum permissible gradient load. This can be accomplished by setting the determined repetitions $TR_{j \in M}$ in which no gradients are to be activated such that the gradient load of the overall scan becomes optimally temporally distributed.

A schematic example of a usable pulse sequence is shown in FIG. 2 using a pulse sequence diagram. Following an excitation pulse RF-A, after an echo time TE, a signal ES shown in each case in the uppermost line (RF) representing the radio-frequency activity, is read out (ADC) in a read-out period R. Depending on the pulse sequence, between the excitation pulse RF-A and the signal ES, further RF pulses can be radiated, the representation of which has been omitted for clarity. Following the excitation pulse RF-A, in the j-th repetition, a gradient sequence $GT_j$, which can include gradients in all gradient directions G, inter alia for spatial encoding, is activated, the exact configuration of which depends again on the type of the selected pulse sequence, and is in principle known to those skilled in the art. The gradient sequence $GT_j$ is therefore only indicated by a box. Following a repetition time TR, the pulse sequence diagram is repeated, as is indicated by the subsequent excitation pulse RF-A, wherein in every repetition j, other gradients can be activated in the gradient sequence $GT_j$. According to the invention, however, for determined repetitions in a set M of determined repetitions j∈M, no gradients are activated in the gradient sequence $GT_{j \in M}$.

FIG. 3 schematically shows an inventive magnetic resonance apparatus 1. This has a scanner with a magnet 3 that generates the basic magnetic field, a gradient unit 5 for generating the gradient fields, a radio-frequency unit 7 for radiating and receiving radio-frequency signals, and a control computer 9 configured to implement the inventive method. In FIG. 3, these subunits of the magnetic resonance apparatus 1 are shown only schematically. In particular, the radio-frequency unit 7 can be composed of multiple subunits, for example, a number of coils such as the schematically shown coils 7.1 and 7.2, or more coils, can be configured either only to transmit radio-frequency signals or only to receive the triggered radio-frequency (MR) signals, or both.

In order to examine an examination object U, for example, a patient or a phantom, it can be introduced on a table L into the scanner of the magnetic resonance apparatus 1, i.e., into the scanning volume thereof. The slice S represents an exemplary target volume of the examination object from which scan data can be recorded.

The control computer 9 serves to control the magnetic resonance apparatus and can control the gradient unit 5 via a gradient controller 5', and the radio-frequency antenna 7 via a radio-frequency transmission/receiving controller 7'. The gradient controller 5' has gradient amplifiers GPA and transformers for generating voltages (not shown) needed for the desired gradient fields. A capacity utilization determining processor 5a determines the gradient capacity utilization, e.g. $G_i^2$ (i=x, y, z). The radio-frequency antenna 7 can have a number of channels, in which signals can be individually transmitted or received.

The radio-frequency antenna is responsible, together with the radio-frequency transmission/receiving controller 7', for the generation and radiation (transmission) of a radio-frequency alternating field for manipulation of the nuclear spins in a region to be manipulated (for example, in slices S to be scanned) of the examination object U. The center frequency of the radio-frequency alternating field, also designated the B1 field, must lie close to the resonance frequency of the spin to be manipulated. In order to generate the B1 field, in the radio-frequency antenna 7, currents controlled by the radio-frequency transmission/receiving controller 7' are applied to the RF coils.

The control computer 9 further has a capacity utilization reduction processor 15, which determines which repetitions should be played out without activating gradients, in order to reduce a gradient capacity utilization so that a desired repetition time TR can be used without overloading the gradient unit 5. The control computer 9 is configured overall to implement the inventive method for preventing artifacts during the acquisition of MR data of an examination object.

An arithmetic unit 13 of the control computer 9 is configured to carry out all the computation operations necessary for the required scans and determinations. Preliminary results and results needed for this purpose can be stored in a memory 17 of the control computer 9. The units shown are not necessarily to be understood as physically separate units, but represent only a subdivision into functional units, which can be realized in fewer units or only in one single physical unit.

Via an input/output device E/A of the magnetic resonance apparatus 1, for example, control commands can be entered by a user into the magnetic resonance apparatus 1 and/or results of the control computer 9, such as image data, can be displayed.

The method described herein can be the form of program code of an electronically readable data storage medium 26. The program code cause the control computer 9 of the magnetic resonance apparatus 1 to implement the method as described.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating magnetic resonance (MR) scan data of an examination object, comprising:
   operating an MR data acquisition scanner, while an examination object is situated therein, to radiate radio-frequency (RF) pulses and to activate magnetic field gradients in order to read out MR signals generated by nuclear spins in the examination object produced by the RF pulses, in a pulse sequence, and storing numerical values corresponding to the MR signals that are read out, as MR scan data; and
   operating said scanner to execute a plurality of repetitions of said pulse sequence while activating respective other magnetic field gradients, until all desired MR scan data are stored and, in determined repetitions in said plurality of repetitions, activating no magnetic field gradients.

2. A method as claimed in claim 1 comprising, in each repetition in said plurality of repetitions, radiating an excitation RF pulse.

3. A method as claimed in claim 1 comprising, in a computer that operates said scanner, determining said determined repetitions in which no magnetic field gradients are activated based on an ascertained gradient capacity utilization of a gradient coil system that is operated by said computer in order to activate said magnetic field gradients and said other magnetic field gradients.

4. A method as claimed in claim 1 comprising determining the determined repetitions in which no magnetic field gradients are activated dependent on a desired repetition time of each repetition in said plurality of repetitions.

5. A method as claimed in claim 1 comprising activating no magnetic field gradients in every n repetitions of said plurality of repetitions.

6. A method as claimed in claim 1 comprising determining the determined repetitions in which no magnetic field gradient is activated in order to cause a mean gradient capacity utilization, of a gradient coil system that is operated in order to activate said gradient magnetic fields and said other gradient magnetic fields, not to exceed a predetermined threshold over a predetermined number of repetitions in said plurality of repetitions.

7. A method as claimed in claim 6 comprising determining said predetermined threshold dependent on hardware limitations of said gradient coil system.

8. A magnetic resonance (MR) apparatus comprising:
an MR data acquisition scanner comprising a gradient coil system, a radio-frequency (RF) system, and a control computer;
a computer configured to operate an MR data acquisition scanner, while an examination object is situated therein, to radiate radio-frequency (RF) pulses and to activate magnetic field gradients in order to read out MR signals generated by nuclear spins in the examination object produced by the RF pulses, in a pulse sequence, and storing numerical values corresponding to the MR signals that are read out, as MR scan data; and
said computer being configured to operate said scanner to execute a plurality of repetitions of said pulse sequence while activating respective other magnetic field gradients, until all desired MR scan data are stored and, in determined repetitions in said plurality of repetitions, to activate no magnetic field gradients.

9. A non-transitory, computer-readable data storage medium encoded with programming instructions, said storage medium being loaded into a computer system of a magnetic resonance (MR) apparatus that comprises an MR data acquisition scanner, said programming instructions causing said computer system to:

operate said MR data acquisition scanner, while an examination object is situated therein, to radiate radio-frequency (RF) pulses and to activate magnetic field gradients in order to read out MR signals generated by nuclear spins in the examination object produced by the RF pulses, in a pulse sequence, and storing numerical values corresponding to the MR signals that are read out, as MR scan data; and operate said scanner to execute a plurality of repetitions of said pulse sequence while activating respective other magnetic field gradients, until all desired MR scan data are stored and, in determined repetitions in said plurality of repetitions, to activate no magnetic field gradients.

* * * * *